United States Patent
Szopko et al.

(10) Patent No.: US 7,092,684 B2
(45) Date of Patent: Aug. 15, 2006

(54) METHOD AND APPARATUS FOR REDUCING INTERFERING SIGNALS IN A TRANSMITTER

(75) Inventors: Robert Szopko, Palatine, IL (US); Justin N. Annes, Roundlake, IL (US); Gregory T. Nash, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 539 days.

(21) Appl. No.: 10/403,769

(22) Filed: Mar. 31, 2003

(65) Prior Publication Data

US 2004/0192232 A1  Sep. 30, 2004

(51) Int. Cl.
*H04B 1/04* (2006.01)
*H04B 1/00* (2006.01)

(52) U.S. Cl. .............. 455/114.2; 455/63.1; 455/67.13; 455/127.2

(58) Field of Classification Search .............. 455/24, 455/63.1, 67.11, 67.13, 78, 114.2, 115.1, 455/126, 127.1, 127.2
See application file for complete search history.

(56) References Cited

U.S. PATENT DOCUMENTS

| | | | | |
|---|---|---|---|---|
| 3,904,824 A | * | 9/1975 | Caragliano et al. | 455/68 |
| 4,224,622 A | | 9/1980 | Schmidt | 343/7.4 |
| 5,444,864 A | * | 8/1995 | Smith | 455/24 |
| 5,564,087 A | * | 10/1996 | Cygan et al. | 455/126 |
| 5,819,165 A | * | 10/1998 | Hulkko et al. | 455/126 |
| 6,067,448 A | * | 5/2000 | Ho et al. | 455/63.1 |
| 6,507,728 B1 | * | 1/2003 | Watanabe et al. | 455/78 |

* cited by examiner

*Primary Examiner*—Quochien B. Vuong

(57) ABSTRACT

An interference canceller 200 and corresponding method thereof operates to reduce the level of an interfering signal and includes a circulator 202 comprising a transmitter port, a receiver port and an antenna port, a transmission line 210 comprising a first end coupled to the transmitter port and a second end for coupling to a signal source; and a circuit 216, having an input coupled to the receiver port 206 and an output coupled 220 to the transmission line, for providing a phase shifted version of a signal coupled to the input at the output, wherein an interfering signal at the antenna port is reverse coupled to the transmission line by the circulator and coupled to the input of the circuit so as to reduce an amplitude of the interfering signal at the second end 212 of the transmission line. The interference canceller concepts may advantageously be used in a single transmitter version or in a multiple transmitter version (FIG. 4).

9 Claims, 2 Drawing Sheets

METHOD AND APPARATUS FOR REDUCING INTERFERING SIGNALS IN A TRANSMITTER

FIELD OF THE INVENTION

This invention relates in general to communications equipment, particularly radio transmitters, and more specifically to a method and apparatus for reducing interfering signals in a transmitter.

BACKGROUND OF THE INVENTION

A radio system comprising a transmitter is susceptible to a form of interference called intermodulation (IM). IM can be generated when non-linear parts or elements of a transmitter output, often the power amplifier output stages, mix the intended output of the transmitter with an interfering signal. The resultant IM or IM product can reduce the performance of a communication system by lowering the signal to noise ratio in the intended output and creating an IM signal that results in interference for an adjacent or near channel.

One form of IM results when a desired output signal from a transmitter is mixed with an interfering signal reversed coupled from the antenna that is intended to radiate the desired output signal or transmitter signal. Decreasing the amount or amplitude of the interfering signal that is coupled to the transmitter output can reduce this form of IM. This reduction is often done with circulators and isolators, however circulators and isolators have limited effectiveness. A need exists for a method and apparatus for reducing interfering signals in a transmitter.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF PREFERRED EMBODIMENT

Figure 1:
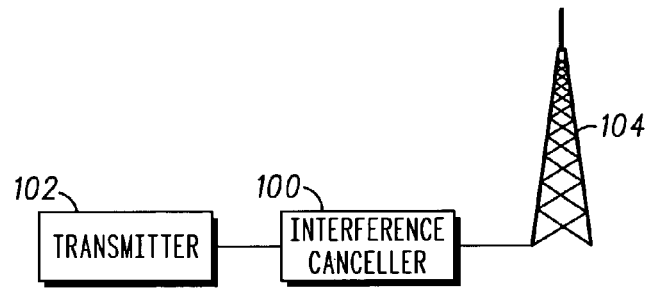
FIG. 1 depicts, in a simplified and representative form, a block diagram of a transmitter with an exemplary interference canceller.

In overview, the present disclosure concerns transmitters that are part of a communication system. More particularly various inventive concepts and principles embodied in methods and apparatus for reducing interfering signals in a transmitter are discussed and defined. The instant disclosure applies to most transmitters but can be of particular interest in those applications where the use of additional circulators or isolators to reduce interfering signals is practically or economically undesirable.

As further discussed below various inventive principles and combinations thereof are advantageously employed to modify and recombine an interfering signal, in some cases in combination with an existing circulator, with the original interfering signal to reduce the overall amplitude of the interfering signal at the transmitter output. This in turn reduces the generation by the transmitter of undesired intermodulation products. In particular, in a transmitter using a circulator, any signal appearing at the antenna port will be reversed coupled to and appear at the transmitter port, attenuated to a level according to the reverse isolation of the circulator, for example 20 decibels (db). The signal appearing at the antenna port will be coupled to the receiver port of the circulator with low insertion loss, such as a few tenths of a db, and thus will be larger in amplitude or power than the signal that is revered coupled from the antenna to transmitter port. The stronger signal obtained at the receiver port can be adjusted through attenuation and phase shifting and applied to a transmission line coupling the transmitter output to the transmitter port of the circulator. By adjusting the attenuation to match the level and by altering the phase to inversely match the phase of the interfering signal reverse coupled through the circulator, the two signals will act to cancel or reduce each other and in the ideal case, completely cancel each other.

Applying the above concept to a second configuration, a known transmitter signal may be used to reduce the same signal appearing at another transmitter as an interfering signal. This may be the case when a plurality of transmitters share an antenna combining network. Using two transmitters as an example, a signal produced by a first transmitter is coupled to an antenna combining network. Some portion of the signal will be reverse coupled through the antenna combining network to a second transmitter output and act as an interfering signal. By sampling the signal at the first transmitter output, phase and level shifting, as before, and applying it to the interfering signal appearing at a second transmitter, the level of both or sum of the two will be reduced. This process can be equally applied for a signal produced by the second transmitter appearing as an interfering signal at the first transmitter.

In both configurations the nature of a directional coupler used to couple the level and phase shifted signal to the transmission line carrying the interfering signal is a consideration. A high directivity coupler is desirable in this case to enable high efficiency coupling of the level and phase shifted signal to the transmission line while minimizing the amount of forward power from the transmitter coupled into the circuitry for adjusting the level and phase. In the second configuration, the coupler used to sample a forward or transmitted signal of the first or second transmitter may be a low directivity, low coupling coupler since ample power is available.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in software programs or instructions and integrated circuits (ICs) such as application specific ICs. It is expected that one of ordinary skill, when guided by the concepts and principles disclosed herein will be readily capable of generating such software instructions and programs and ICs with minimal experimentation. Therefore, in the interest of brevity and minimization of any risk of obscuring the principles and concepts in accordance to the present invention, further discussion of such software and ICs, if any, will be limited to the essentials with respect to the principles and concepts of the preferred embodiments.

Referring to FIG. 1, a simplified and representative block diagram of a transmitter with an exemplary interference canceller will be discussed and described. The interference canceller 100 is coupled to a transmitter 102 and an antenna 104. The desired signal or desired transmitter signal is generated by the transmitter 102, coupled to and through the interference canceller 100, and from there coupled to the antenna 104. An undesired or interfering signal is received or absorbed by the antenna or some element coupled to the antenna side of the interference canceller and passed to the interference canceller where it is split, adjusted and recombined with the original to reduce the level of the resultant combination or interfering signal at the transmitter side of the interference canceller. This will limit, and in the optimal case, eliminate the undesired or interfering signal reaching the transmitter and thus any intermodulation (IM) products or signals that can be generated.

Figure 2:
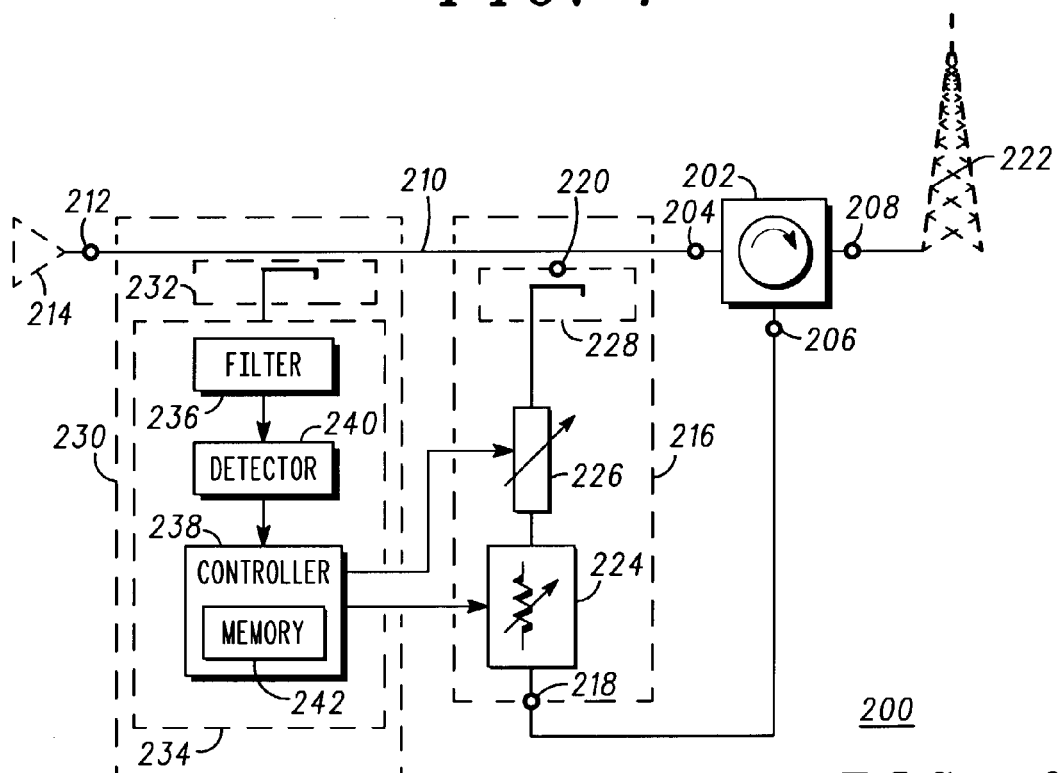
FIG. 2 depicts a diagram of an apparatus for reducing an interfering signal in a transmitter.

Referring to FIG. 2, a diagram of an apparatus for reducing an interfering signal in or at a transmitter will be discussed and described. Note that in the discussions below certain functions normally associated with a transmitter are not discussed nor relevant. For example in most transmitters a harmonic filter will be placed somewhere between the transmitter output and the antenna and typically relatively close to the transmitter output. The interference canceller 200 comprises a circulator 202 having a transmitter port 204, a receiver port 206 and an antenna port 208. It further comprises a transmission line 210 comprising a first end coupled to the transmitter port 204 and a second end 212 for coupling to a signal source 214, for example, a transmitter or transmitter amplifier output stages. The interference canceller also comprises a circuit 216, having an input 218 and an output 220, where the input is coupled to the receiver port 206 and the output is coupled to the transmission line 210. The circuit operates with its input coupled to an undesired or interfering signal that is coupled, in many cases from an antenna 222, to the antenna port and passed through the circulator 202 to the receiver port 206 and thus to the input 218. The undesired or interfering signal thus presented at the input is then level adjusted by attenuator 224 and phase shifted or adjusted by phase shifter 226 and coupled to the output 220. The undesired or interfering signal will also be coupled to the transmission line 210 by reverse coupling through the circulator from the antenna port 208 to the transmitter port 204 where the amount or degree of this coupling will depend on the circulator isolation specifications, typically around 20 dB. The circuit 216 is comprised of a variable attenuator or level shifter 224, a phase shifter 226, and a directional coupler 228 inter coupled as depicted.

The output 220 comprises the directional coupler and may be integral to a portion of the transmission line 210 or, depending on fabrication technique and layout, adjacent to the transmission line as is known.

The transmitter is typical of transmitters used in various infrastructure base stations, such as cellular telephone infrastructure base stations from suppliers such as Motorola and others. The individual components of the interference canceller are known and appreciated by those of ordinary skill. The directional couplers and circulators appropriate to the application are available from a number of commercial suppliers, such as MA/Com. A circulator of this type is exemplified by a FR11-0002 circulator available from the M/ACom Division of Tyco. A directional coupler of the type for coupling the phase and level shifted signal onto the transmission line is exemplified by a 2020-6600-06 coupler available from the M/ACom Division of Tyco exhibiting 6 db coupling and 25 db directivity. The directional coupler used for sampling a transmitter signal in another configuration is exemplified by a 2026-6012-20 coupler available from the M/ACom Division of Tyco exhibiting 20 db coupling and 15 db directivity. Care must be used in selecting the couplers and their loading to be able to handle the power loads and to minimize the coupler as a source of intermodulation products. These considerations are implementation specific but are understood by those with average skill in the art.

The phase shifter 226 or variable phase shifter is known and available from a number of suppliers, for example, a Skyworks Solutions model PS094-315. The level shifter or attenuator or variable attenuator is known and available, for example, Skyworks Solutions as model number AV131-315.

In operation, an interfering signal is reverse coupled through the circulator 202 from antenna port 208 to transmitter port 204 and onto the transmission line 210. The interfering signal is further coupled to the output stages of a signal source, for example, a transmitter amplifier, at the second end of the transmission line 212 where the interfering signal can be mixed with the output signal from the transmitter and generate or cause intermodulation products or IM interference and thus reduce the performance of the system.

The interfering signal is also forward coupled from the antenna port 208 to the receiver port 206. The interfering signal forward coupled is level shifted and phase shifted resulting in a signal that is ideally 180 degrees out of phase and matched to the amplitude of the interfering signal as reverse coupled through the circulator onto the transmission line. The interfering signal at the antenna port is thus coupled to the transmission line 210 by the circulator 202 and circuit 216 so as to reduce the amplitude of the interfering signal at the second end 212 of the transmission line 210 that results from the interfering signal being coupled, specifically reverse coupled, from the antenna port 208 to the transmitter port 204 of the circulator 202.

In one exemplary embodiment, the circuit 216 comprises a directional coupler 228 for coupling to the transmission line 210, a level shifter 224, that may be a variable attenuator for level shifting a signal at the antenna port 206 coupled to the transmission line by the circulator 202 and the circuit 216, a phase shifter 226 that may be a variable phase shifter for phase shifting the signal at the antenna port 206 coupled to the transmission line 210 by the circulator 202 and the circuit 216, all series coupled, either as depicted or with the level shifter 226 and phase shifter reversed, between the input 218 and the output 220.

The interference canceller, preferably, further comprises a calibration apparatus 230. The calibration apparatus can comprise a sensor 232, for example a directional coupler, coupled to the transmission line and a second circuit 234. The sensor acts to couple a signal from the transmission line 210 to the second circuit 234. The second circuit 234 is coupled to and operates, preferably, to control the level shifter 224 and phase shifter 226. The second circuit may comprise a filter 236 coupled to a detector 240, with the detector coupled to a controller 238. The controller may also comprise on-board memory 242 for operational instructions and calibration data.

The calibration circuit is operable to sense the level of the interfering components and adjust the phase and level shifters. This can be accomplished by any of several methods. For example, the filter is ordinarily a notch filter 236 that reduces or rejects the forward or output signal from the transmitter, a detector 240 to sense the level of the remaining signal, that is, the interfering signal, and the controller 238 to algorithmically adjust the phase and attenuation of the signal coupled from the, receiver port of the circulator, separately or in combination, until a reduced level of the interfering components is reached. This is a common task and can be developed by one of average skill in the art without undue experimentation, given the concepts and principles discussed and disclosed herein. The components of the calibration circuit are known and available. The directional coupler is typical of that of the interference canceller and is exemplified by the 2020-6600-06 coupler available from the M/ACom Division of Tyco. Filter design is known in the art. The controller is known and available from suppliers such as Motorola and others.

Another exemplary embodiment of the calibration apparatus comprises a field programmable gate array, one serial digital to analog converter and operational amplifier coupled to the variable phase shifter 226 and a second serial digital to analog converter and operational amplifier coupled to the variable attenuator 224. A series of interfering signal measurements may be taken manually using a spectrum analyzer and the digital-to-analog converter settings for phase and attenuation are programmed into the field programmable gate array. The settings may represent differing conditions such as power level and operating mode. The components for this embodiment are known and available and given the concepts and principles discussed and disclosed the establishing the particular settings will be within the realm of one of ordinary skill.

In operation, the calibration apparatus 230 comprises the sensor 232 coupled to the transmission line 210, for providing a sensing signal, the sensing signal corresponding to a combination of the interfering signal at the antenna port 208 coupled to the transmission line 210 by the circulator 202 and circuit 216 and the interfering signal at the second end of the transmission line 212 that results from the interfering signal being coupled from the antenna port 208 to the transmitter port 204 of the circulator 202. The calibration apparatus also comprises a control circuit 234 coupled to the sensor operable to adjust one or both of the variable attenuator 224 and the variable phase shifter 226 according to the sensing signal so as to reduce the level of the combination signal.

Figure 3:
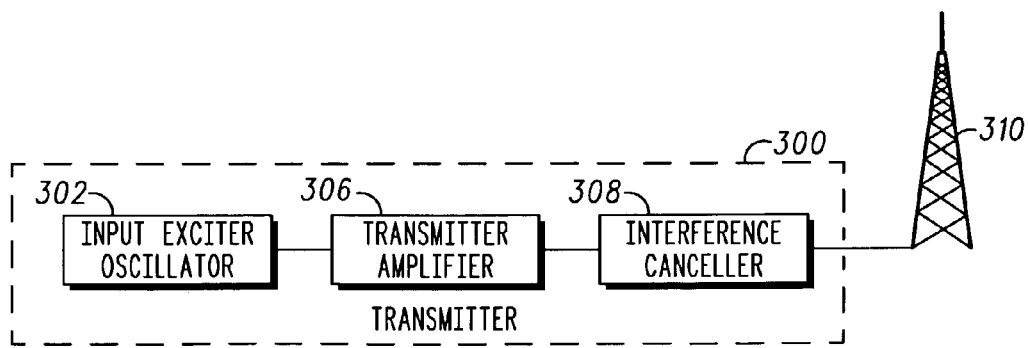
FIG. 3 depicts, in a simplified and representative form, a more detailed block diagram of a transmitter using an interference canceller.

Referring to FIG. 3, a simplified and representative block diagram of a transmitter including an interference canceller is discussed and described. Note that the transmitter and interference canceller may be viewed as individual devices or as an integral unit. A transmitter 300 comprises several blocks including a front end 302 comprising input circuitry, an exciter and an oscillator. An originating or base band signal is developed and processed and modulated onto a carrier and passed to a transmitter amplifier 306, sometimes called a power amplifier where its power level is increased and passed to the interference canceller 308. Following the process discussed above, undesired signals that are potential causes of intermodulation products are reduced in the interference canceller 308. The forward signal from the transmitter amplifier is couple through the interference canceller to the antenna 310.

In operation, the transmitter uses the interference canceller for reducing the level of an interfering signal. The transmitter comprises a transmitter amplifier 306 having a transmit output and the interference canceller 308 coupled to the transmit output. The following discussion will be a summary of much of the discussions above and thus is presented at an overview level. The interference canceller 308 includes a circulator comprising a transmitter port, a receiver port and an antenna port. The interference canceller further comprises a transmission line with a first end coupled to the transmitter port and a second end coupled to the transmit output and a circuit, having an input and an output, where the input is coupled to the receiver port and provides a phase shifted version of a signal coupled to the input at the output of the circuit and the output is coupled to the transmission line.

When an interfering signal at the antenna port is coupled to the transmission line by the circulator and circuit it acts to reduce the amplitude of the interfering signal at the second end of the transmission line that results when the interfering signal is coupled from the antenna port to the transmitter port of the circulator. The circuit comprises an attenuator to adjust a amplitude of the interfering signal coupled to the transmission line by the circulator and circuit and also comprises a phase shifter to adjust a phase of the interfering signal coupled to the transmission line by the circulator and circuit. The circuit preferably further comprises a directional coupler for coupling to the transmission line, wherein the attenuator, the phase shifter and the directional coupler are series coupled. Further details of this interference canceller are discussed above with reference to FIG. 3 and below with reference to FIG. 4.

Figure 4:
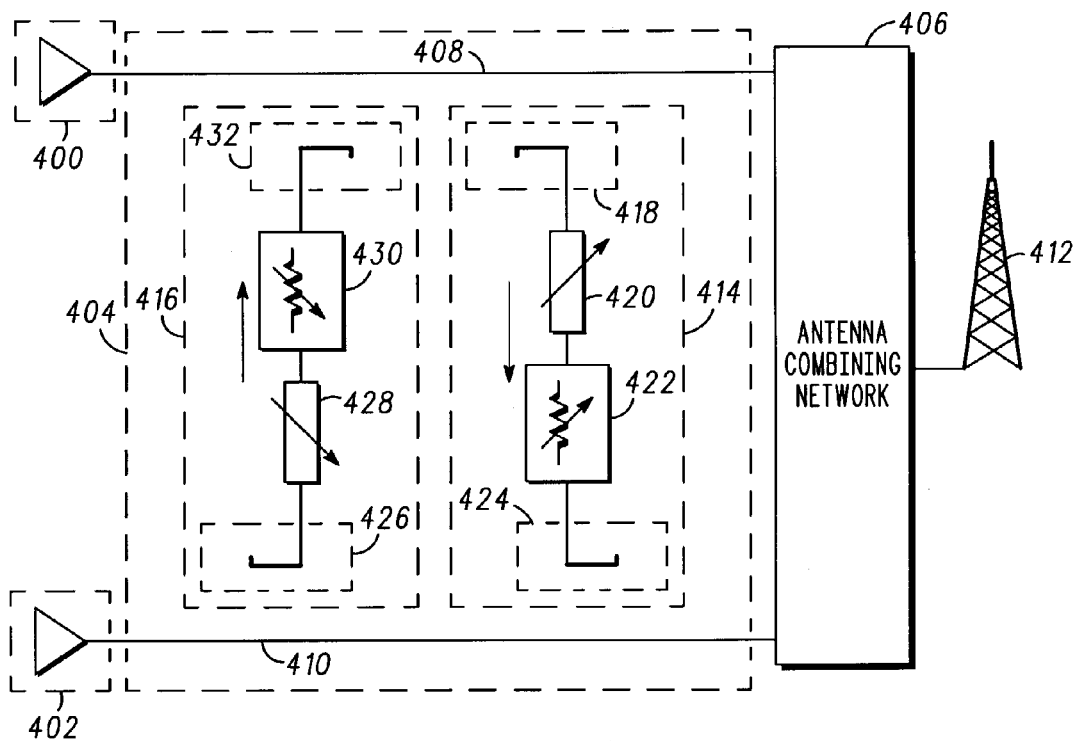
FIG. 4 depicts a block diagram of an apparatus for reducing interfering signals for use with a plurality of transmitters.

Referring to FIG. 4 a simplified and representative form of a block diagram of an intermodulation reduction apparatus for reducing interfering signals for use when a plurality of transmitters are present is discussed and described. In an exemplary embodiment with two transmitters, a first transmitter 400 and a second transmitter 402 are coupled through an interference canceling apparatus 404 to an antenna combining network 406 by, respectively, a first transmission line 408 and a second transmission line 410. The output of the antenna combining network may be coupled, for example, to an antenna 412.

A major function of the antenna combining network 406 is to couple each transmitter to the common antenna while isolating the output signal of the first and second transmitters from being reverse coupled back into, respectively, the second and first transmitters. The ability of an antenna combining network to limit this reverse coupling is known as its isolation. Unfortunately the isolation performance is often not sufficient to avoid undesired IM products being generated in the amplifiers.

The interference canceling apparatus 404 is comprised of a first circuit 414 coupled from the first transmission line 408 to the second transmission line 410 and a second circuit 416 coupled from the second transmission line 410 to the first transmission line 408. The first and second circuits may be identical assuming the transmitters 400, 402, etc. are identical. The first circuit 414 comprises a directional coupler 418, for coupling a portion of the signal from the first transmitter to a phase shifter 420 and to a level shifter 422. After phase shifting and level shifting, the resultant signal is coupled to the second transmission line by a second directional coupler 424. The second circuit 416 comprises a directional coupler 426, for coupling a portion of the signal from the second transmitter 402 to a phase shifter 428 and from there to a level shifter 430. After phase shifting and level shifting, the resultant signal is coupled to the first transmission line 408 by a second directional coupler 432. The components of the first and second circuit are known and available as described above. The antenna combining network is also known and available. An antenna combining network of this type is exemplified by a T-1000 combiner available from the M/ACom Division of Tyco exhibiting 45 db isolation.

In operation, the intermodulation reduction apparatus comprises the first transmission line 408 with a first transmit output coupled to a first port of an antenna combining network 406 and a first transmit input for coupling to a first transmitter 400 and a second transmission line 410 comprising a second transmit output coupled to a second port of the antenna combining network 406 and a second transmit input for coupling to a second transmitter 402. The intermodulation reduction apparatus 404 further comprises an interference canceling apparatus 404 cross coupled between the first transmission line 408 and the second transmission line 410 operable to couple a first signal to the second transmission line, the first signal corresponding to a first transmit signal at the first transmit input and operable to couple a second signal to the first transmission line, the second signal corresponding to a second transmit signal at the second transmit input.

The first signal and the second signal act, respectively, to reduce the amplitude of the first transmit signal and the second transmit signal as, respectively, reverse coupled to the second transmission line and the first transmission line through the antenna combining network. This is accomplished in a manner similar to that described above wherein the undesired signal of, for example, the first transmitter 400 is reverse coupled to the second transmission line 410 through the antenna combining network 406 and is cancelled in part or in whole by a version of the signal as sampled at and coupled from the first transmission line. The sampled signal is phase and level shifted in the first circuit 414, in the ideal case, to match the level and inversely match the phase of the signal reverse coupled through the antenna combining network 406, and when coupled onto the second transmission line 410 will combine with the signal reverse coupled through the antenna combining network to reduce the level of the combination of both signals, giving the desired result.

To accomplish the phase and level shifting, the first circuit 414 and second circuit 416 each comprises an input comprising a first directional coupler 418, 426 and an output comprising a second directional coupler 424, 432, and a level shifter 422, 430 and a phase shifter 420, 430 series connected between the input and output for providing a phase shifted version of a signal coupled to the input at the output. In an exemplary embodiment the level shifter 422, 430 may be a variable attenuator and the phase shifter 420, 430 may be a variable phase shifter.

As noted above with reference to FIG. 2 the level shifters and phase shifters are series coupled and either order of the two components may be used. Furthermore although not specifically depicted, a calibration apparatus may be used to sense undesired results and control appropriate adjustment of the phase and level shifters. Given the discussions and description above such an apparatus will be within the realm of set of one of ordinary skills.

Figure 5:
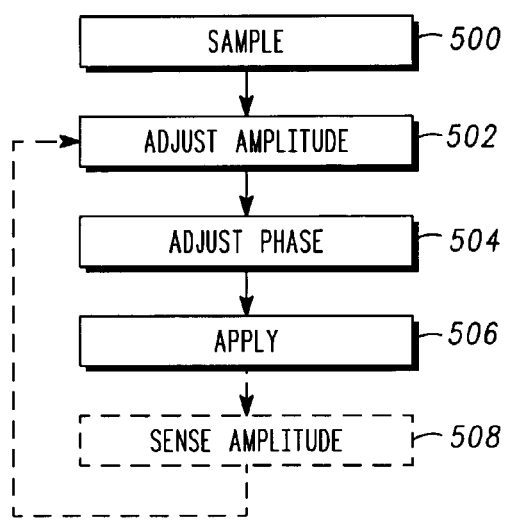
FIG. 5 depicts, a simple flowchart of a method embodiment for reducing an interfering signal in a transmitter.

Referring to FIG. 5 a simplified and representative form of a method for reducing an interfering signal in a transmitter will be discussed and described. Many of the concepts and principles embodied and used by the method of FIG. 5 have been discussed and described above so this description will be more of or somewhat of a summary and overview of the method. The method begins with sampling 500 an undesired signal to create a correction signal, the correction signal corresponding for example to the undesired signal at the receiver port of the circulator in FIG. 2 or the portion of the output signal from one amplifier in FIG. 4 at for example the output of the directional coupler 418, 426.

The correction signal can be amplitude adjusted 502 or phase adjusted 504 to provide an adjusted version of the correction signal. For example, it is preferred to match the level of the undesired signal that will be reverse coupled through a circulator or antenna combining network from the antenna port to a transmitter port. This may be accomplished by using an attenuator or a variable attenuator. After amplitude adjustment, the correction signal can be phase adjusted 504 by approximately 180 degrees, accounting for any difference in path length or other phase shifts between the undesired signal as presented to a transmitter output and the correction signal when combined. For example, it is preferred, to inversely match the phase of the undesired signal reverse coupled from the antenna port to the transmitter port of FIG. 2 or transmission line or transmitter port of the antenna combining network of FIG. 4 to create an adjusted, amplitude and phase, adjusted version of the correction signal. This can be accomplished using a phase shifter or a variable phase shifter. The adjusted version of the correction signal is applied 506 to the transmission line by coupling the correction signal to the transmission line, for example, using a directional coupler, to reduce the amplitude of the undesired radio frequency signal as reverse coupled through an isolator, in this case a circulator. The method applies equally to the exemplary embodiment covered in the description of FIG. 4. The order of phase adjusting 504 and level adjusting 502 is not significant.

In an exemplary embodiment, the method may be extended by sensing 508 the amplitude of the undesired radio frequency signal as reverse coupled through the isolator to create a control signal and reducing the amplitude of the resultant undesired radio frequency signal obtained by adding to the undesired radio frequency signal as reverse coupled through an isolator, the adjusted version of the correction signal and then returning to 502 so as to adjust the amplitude and phase, for example, in an iterative manner under the control of a processor, to reduce the resultant undesired radio frequency signal.

The processes, apparatus, and systems, discussed above, and the inventive principles thereof are intended to and will alleviate problems caused by interfering signals reaching the non-linear output components of a transmitter. Sampling or obtaining an interfering signal, either from a receiver port of a circulator or directly from another transmitter known to cause interference and then reapplying an adjusted version of the signal to reduce interfering signal levels may provide significant interference reduction at a nominal cost compared to previous methods.

Various embodiments of the method and apparatus for reducing interfering signals in a transmitter have been discussed and described. It is expected that these embodiments or others in accordance with the present invention will have application to many transmitter applications and configurations that are susceptible to interfering signals, particularly intermodulation-causing interfering signals. The disclosure extends to the constituent elements or equipment comprising such systems and specifically the methods employed thereby and therein.

Using the inventive principles and concepts disclosed herein advantageously allows or provides for low latency and low network overhead access to contact information for groups of communications units or devices and procedures for maintaining such information which will be beneficial to users and providers a like. This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An interference canceller for reducing the level of an interfering signal comprising:
   a circulator comprising a transmitter port, a receiver port and an antenna port;
   a transmission line comprising a first end coupled to the transmitter port and a second end for coupling to a signal source; and
   a circuit, having an input and an output, the input coupled to the receiver port and the output coupled to the transmission line, for providing a phase shifted version of a signal coupled to the input at the output:
   wherein an interfering signal at the antenna port is coupled to the transmission line by the circulator and the circuit so as to reduce an amplitude of the interfering signal at the second end of the transmission line that results from the interfering signal being coupled from the antenna port to the transmitter port of the circulator; and
   wherein the circuit comprising
      a directional coupler for coupling to the transmission line;
      a variable attenuator for level shifting a signal at the antenna port coupled to the transmission line by the circulator and the circuit;
      a variable phase shifter for phase shifting the signal at the antenna port coupled to the transmission line by the circulator and the circuit, all series coupled between the input and the output; and
      a calibration apparatus comprising:
      a sensor coupled to the transmission line, for providing a sensing signal, the sensing signal corresponding to a combination of the interfering signal at the antenna port coupled to the transmission line by the circulator and circuit and the interfering signal at the second end of the transmission line that results from the interfering signal being coupled from the antenna port to the transmitter port of the circulator; and
      a control circuit coupled to the sensor operable to adjust one of the variable attenuator and the variable phase shifter according to the sensing signal.

2. The interference canceller of claim 1 wherein the circuit comprises a level shifter to adjust an amplitude of the interfering signal coupled to the transmission line by the circulator and circuit.

3. The interference canceller of claim 2 wherein the level shifter is a variable attenuator.

4. The interference canceller of claim 1 wherein the circuit further comprises a phase shifter to adjust a phase of the interfering signal coupled to the transmission line by the circulator and circuit.

5. The interference canceller of claim 4 wherein the phase shifter is a variable phase shifter.

6. A transmitter using an interference canceller for reducing the level of an interfering signal comprising:
   a transmitter amplifier having a transmit output; and
   the interference canceller comprising:
      a circulator comprising a transmitter port, a receiver port and an antenna port;
      a transmission line comprising a first end coupled to the transmitter port and a second end coupled to the transmit output; and
      a circuit, having an input and an output, the input coupled to the receiver port, for providing a phase shifted version of a signal coupled to the input at the output, the output coupled to the transmission line;
      wherein an interfering signal at the antenna port is coupled to the transmission line by the circulator and circuit so as to reduce the amplitude of the interfering signal at the second end of the transmission line that results from the interfering signal being coupled from the antenna port to the transmitter port of the circulator, and
      wherein the circuit comprising
         a directional coupler for coupling to the transmission line;
         a variable attenuator for level shifting a signal at the antenna port coupled to the transmission line by the circulator and the circuit;
         a variable phase shifter for phase shifting the signal at the antenna port coupled to the transmission line by the circulator and the circuit, all series coupled between the input and the output; and
         a calibration apparatus comprising:
         a sensor coupled to the transmission line, for providing a sensing signal, the sensing signal corresponding to a combination of the interfering signal at the antenna port coupled to the transmission line by the circulator and circuit and the interfering signal at the second end of the transmission line that results from the interfering signal being coupled from the antenna port to the transmitter port of the circulator; and
         a control circuit coupled to the sensor operable to adjust one of the variable attenuator and the variable phase shifter according to the sensing signal.

7. The transmitter of claim 6 wherein the circuit comprises an attenuator to adjust an amplitude of the interfering signal coupled to the transmission line by the circulator and circuit.

8. The transmitter of claim 7 wherein the circuit further comprises a phase shifter to adjust a phase of the interfering signal coupled to the transmission line by the circulator and circuit.

9. The transmitter of claim 8 wherein the circuit further comprises a directional coupler for coupling to the transmission line, wherein the attenuator, the phase shifter and the directional coupler are series coupled.

* * * * *